United States Patent
Thomas

(10) Patent No.: US 9,275,757 B2
(45) Date of Patent: Mar. 1, 2016

(54) APPARATUS AND METHOD FOR NON-INTRUSIVE RANDOM MEMORY FAILURE EMULATION WITHIN AN INTEGRATED CIRCUIT

(71) Applicant: Mathieu Thomas, Vence (FR)

(72) Inventor: Mathieu Thomas, Vence (FR)

(73) Assignee: Scaleo Chip, Valbonne, Sophia Antipolis (FR)

( * ) Notice: Subject to any disclaimer, the term of this patent is extended or adjusted under 35 U.S.C. 154(b) by 0 days.

(21) Appl. No.: 13/756,918

(22) Filed: Feb. 1, 2013

(65) Prior Publication Data

US 2014/0217406 A1    Aug. 7, 2014

(51) Int. Cl.
*G11C 29/38* (2006.01)
*G01R 31/3193* (2006.01)
*G01R 31/319* (2006.01)
*G11C 29/44* (2006.01)

(52) U.S. Cl.
CPC ............ *G11C 29/38* (2013.01); *G01R 31/3193* (2013.01); *G01R 31/31905* (2013.01); *G11C 29/44* (2013.01)

(58) Field of Classification Search
CPC ............ G11C 29/38; G01R 31/31905; G01R 31/3193
USPC ......................................... 714/735–737, 718
See application file for complete search history.

(56) References Cited

U.S. PATENT DOCUMENTS

| | | | |
|---|---|---|---|
| 4,005,405 A * | 1/1977 | West .............................. | 714/765 |
| 4,669,081 A * | 5/1987 | Mathewes et al. ............ | 714/703 |
| 4,759,019 A * | 7/1988 | Bentley et al. ................ | 714/703 |
| 4,873,705 A | 10/1989 | Johnson | |
| 4,875,209 A * | 10/1989 | Mathewes et al. ............ | 714/703 |
| 5,274,646 A | 12/1993 | Brey et al. | |
| 5,325,365 A | 6/1994 | Moore et al. | |
| 5,428,624 A * | 6/1995 | Blair et al. .................... | 714/727 |
| 5,471,482 A * | 11/1995 | Byers et al. ................... | 714/719 |
| 5,475,624 A | 12/1995 | West | |
| 5,664,159 A | 9/1997 | Richter et al. | |
| 5,668,816 A * | 9/1997 | Douskey et al. .............. | 714/720 |
| 5,784,323 A * | 7/1998 | Adams et al. ................. | 365/201 |
| 5,828,824 A | 10/1998 | Swoboda | |

(Continued)

OTHER PUBLICATIONS

Folkesson, Peter, et al., "A Comparison of Simulation Based and Scan Chain Implemented Fault Injection", *Twenty-Eighth Annual International Symposium on Fault-Tolerant Computing, 1988. Digest of Papers.*, (Jun. 23-25, 1998), pp. 284-293.

*Primary Examiner* — Joseph D Torres
(74) *Attorney, Agent, or Firm* — Blakely Sokoloff Taylor & Zafman LLP

(57) ABSTRACT

The system and methods allow for emulation of random hardware failure of an internal embedded memory array of an integrated circuit (IC) device. Emulation of potential defects is performed in order to evaluate the behavior of the rest of the design. This non-intrusive emulation is performed in a pseudo-functional mode in order to evaluate the behavior of one or more memory cores in their standard functional mode. The solution enables the creation of failures and tracking both the detection of the failures and the time required time for detection. Specifically, the emulation of an internal memory array with respect of random failures and the associated diagnostic mechanism ensures that detection and correction mechanisms work as expected. A typical non-limiting use case is to ensure that safety control logic of an IC behaves as expected in cases of data corruption within an embedded memory core.

15 Claims, 4 Drawing Sheets

(56) References Cited

U.S. PATENT DOCUMENTS

| | | |
|---|---|---|
| 5,903,719 A | 5/1999 | Yamamoto |
| 5,937,154 A | 8/1999 | Tegethoff |
| 5,978,935 A * | 11/1999 | Kim et al. .................... 714/42 |
| 6,009,256 A | 12/1999 | Tseng et al. |
| 6,009,541 A | 12/1999 | Liu et al. |
| 6,014,504 A * | 1/2000 | Saine et al. ................. 716/136 |
| 6,035,420 A | 3/2000 | Liu et al. |
| 6,061,274 A * | 5/2000 | Thibault et al. ......... 365/189.05 |
| 6,067,262 A * | 5/2000 | Irrinki et al. ................. 365/201 |
| 6,269,455 B1 | 7/2001 | Deas |
| 6,338,148 B1 | 1/2002 | Gillenwater et al. |
| 6,457,149 B1 | 9/2002 | Uehara |
| 6,496,950 B1 * | 12/2002 | Zhao et al. .................. 714/718 |
| 6,536,008 B1 * | 3/2003 | Nadeau-Dostie et al. .... 714/726 |
| 6,557,115 B2 | 4/2003 | Gillenwater et al. |
| 6,769,084 B2 * | 7/2004 | Kim et al. .................... 714/739 |
| 6,785,873 B1 | 8/2004 | Tseng |
| 6,842,865 B2 | 1/2005 | Nee et al. |
| 6,862,565 B1 | 3/2005 | Zheng |
| 7,038,955 B2 * | 5/2006 | Susuki et al. ................ 365/201 |
| 7,149,924 B1 | 12/2006 | Zorian et al. |
| 7,184,915 B2 * | 2/2007 | Hansquine et al. ........... 702/118 |
| 7,222,282 B2 | 5/2007 | Park |
| 7,222,800 B2 | 5/2007 | Wruck |
| 7,278,078 B2 * | 10/2007 | Hii et al. ...................... 714/733 |
| 7,284,159 B2 | 10/2007 | Chakraborty et al. |
| 7,392,442 B2 * | 6/2008 | Averbuj et al. ............... 714/718 |
| 7,409,610 B1 * | 8/2008 | Drimer ........................ 714/725 |
| 7,472,051 B2 * | 12/2008 | Mariani et al. ................ 703/13 |
| 7,483,824 B1 | 1/2009 | Hill |
| 7,487,421 B2 | 2/2009 | Damodaran et al. |
| 7,519,875 B2 * | 4/2009 | Rearick et al. ............... 714/710 |
| 7,539,900 B1 | 5/2009 | Plofsky |
| 7,814,380 B2 * | 10/2010 | Averbuj et al. ............... 714/718 |
| 7,827,438 B2 | 11/2010 | Tarta |
| 7,856,581 B1 | 12/2010 | Tabatabaei et al. |
| 7,869,293 B1 | 1/2011 | Morein |
| 8,051,346 B2 * | 11/2011 | Somasundaram et al. .... 714/724 |
| 8,112,730 B2 | 2/2012 | Aleksanyan et al. |
| 8,176,372 B2 * | 5/2012 | Anzou et al. ................. 714/719 |
| 8,296,613 B2 | 10/2012 | La Fever et al. |
| 2006/0126799 A1 * | 6/2006 | Burk ........................ 379/26.01 |
| 2009/0193296 A1 * | 7/2009 | Kellington et al. ............. 714/33 |
| 2012/0239993 A1 * | 9/2012 | Chung ........................ 714/727 |
| 2013/0212445 A1 | 8/2013 | Doerr et al. |

* cited by examiner

APPARATUS AND METHOD FOR NON-INTRUSIVE RANDOM MEMORY FAILURE EMULATION WITHIN AN INTEGRATED CIRCUIT

BACKGROUND OF THE INVENTION

1. Field of the Invention

The invention generally relates to failure detection and correction mechanisms for an integrated circuit (IC), and more particularly to emulation of random failures within a memory core of an IC.

2. Prior Art

Failure detection and correction mechanisms that are integrated within an integrated circuit (IC) aim to deal with malfunctions that randomly appear during a device's life time. Since such failure occurs randomly there is no direct way to test that the embedded detection and correction mechanisms work as expected on silicon. It would therefore be advantageous to provide a solution for emulation of such failure mechanism that would enable to ensure proper operation of a device or at least timely detection of a failure. This is of particular importance within embedded memory units commonly used in today's small and large devices.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION OF THE PREFERRED EMBODIMENTS

Figure 1:
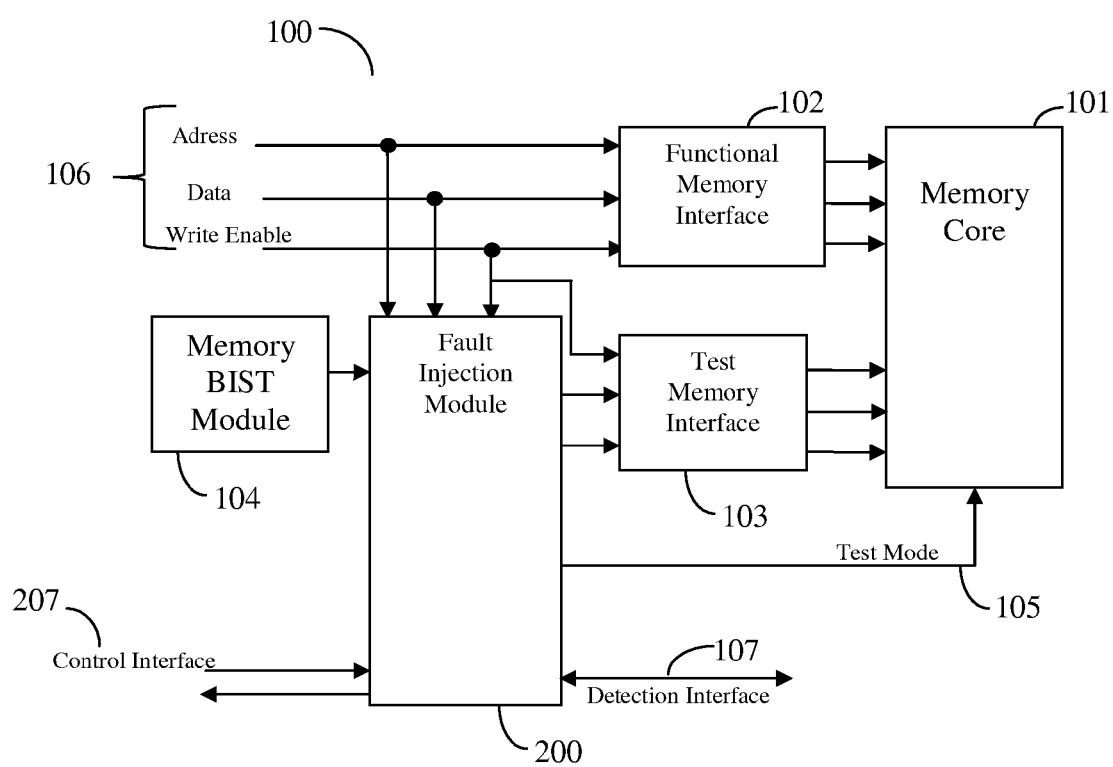
FIG. 1 is a schematic block diagram of a system architecture for testing a memory core according to an embodiment.

It is important to note that the embodiments disclosed by the invention are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality. In the drawings, like numerals refer to like parts through several views.

The system and methods allow for emulation of random hardware failure of an internal embedded memory array of an integrated circuit (IC). Emulation of potential defects is performed in order to evaluate the behavior of the rest of the design. This non-intrusive emulation is performed in a pseudo-functional mode in order to evaluate the behavior of one or more memory cores in their standard functional mode. The solution enables the creation of failures and tracking both the detection of the failures and the time required time for detection. Specifically, the emulation of an internal memory array with respect of random failures and the associated diagnostic mechanism ensures that detection and correction mechanisms work as expected. A typical non-limiting use case is to ensure that safety control logic of an IC behaves as expected in cases of data corruption within an embedded memory core.

The system and methods allow covering a large range of detection mechanisms. As an illustration, a data corruption may be used to check the behavior of memory integrity checker such as Error Correcting Code (ECC), when a corruption of address may corrupt the set of data used for a CPU calculation and then check a CPU lock-step mechanism is working properly.

FIG. 1 is an exemplary and non-limiting block diagram of architecture of a system 100 according to an embodiment. The diagram shows a memory core 101 that is accessible through a functional memory interface 102, as well as an optional test memory interface 103. The functional memory interface 102 is configured for sending functional data 106. The test memory interface 103 is configured in test mode to send data from a memory built-in self-test (BIST) module 104 to test memory core 101. Fault injection module (FIM) 200 configured to send to the test memory interface 103 either corrupted or non-corrupted data from any one of the memory BIST module 104 or the data provided on interface 106. The interface 106 provides the address within the memory core, the data to be written therein, and a write enable signal. FIM 200 may force the memory core 101 to run using its test memory interface 103 when running in functional mode. This is handled by a control of the test mode signal 105 that allows switching the interface used by the memory core 101. When activated, the FIM 200 sends either the functional data supplied on interface 106 to the memory core 101 or an internally generated corrupted data. One of ordinary skill in the art would readily appreciate that the system 100 allows to create a failure and to track both the detection of this failure and the required time for this detection through feedback provided from the detection interface 107.

Figure 2:
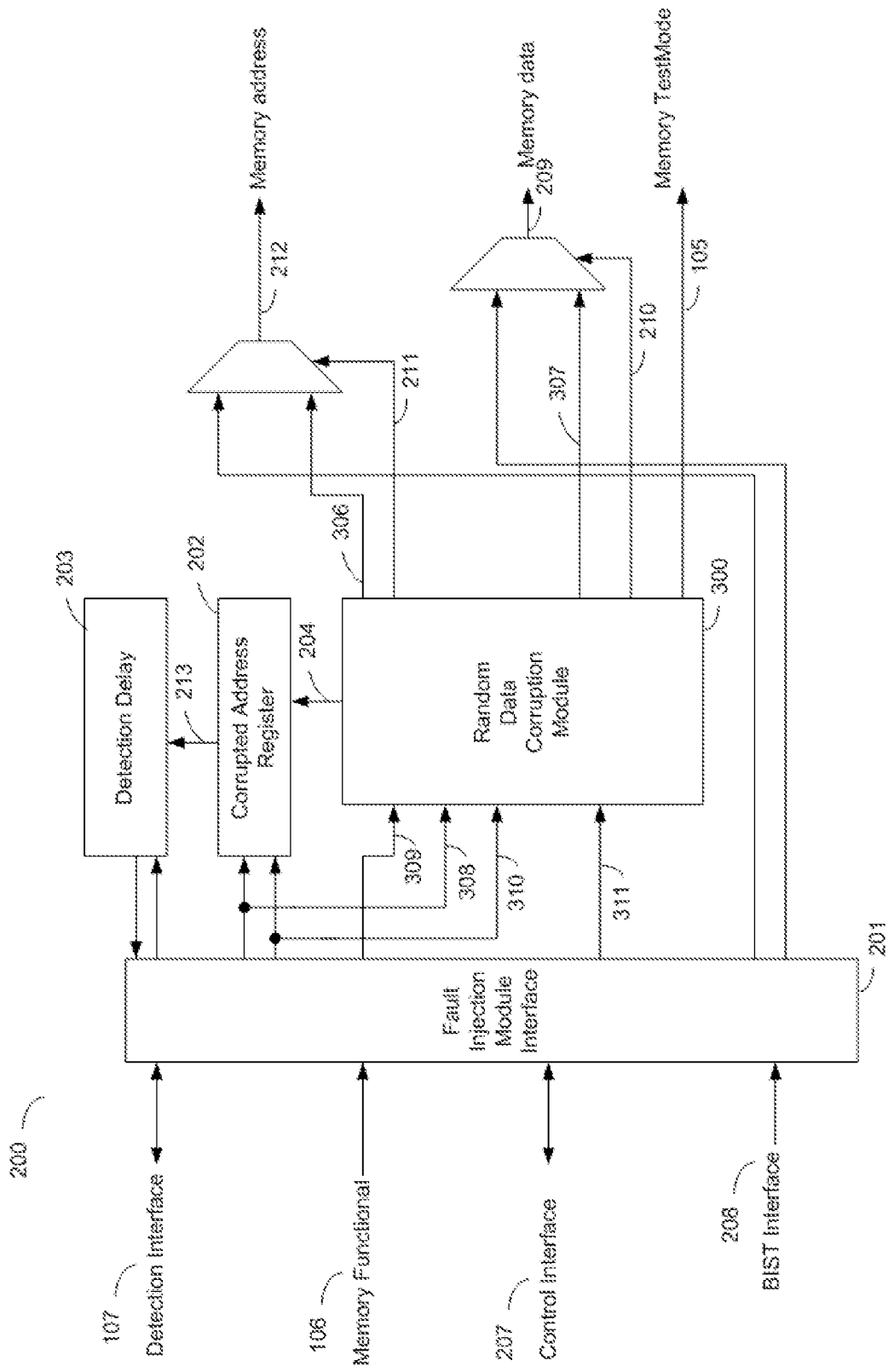
FIG. 2 is a schematic block diagram of a fault injection module (FIM) according to an embodiment.

FIG. 2 is an exemplary and non-limiting schematic of the FIM 200 according to an embodiment. The module 200 is connected to a system, such as system 100, through a FIM interface 201. Fault injection module 200 includes a detection interface 107 for allowing information exchange between an IC mechanisms in charge of the error detection and the FIM 200, BIST Interface 208 for collecting the signal provided by a memory BIST module, such as memory BIST module 104 shown in FIG. 1, interface 106 for receiving the functional signals driving the memory core 101 in functional mode, and a control interface 207 for managing the FIM 200. A Control Interface 207 allows controlling the FIM behavior.

The FIM 200 aims to emulate an internal memory error in order to check the error detection mechanisms of the IC are working as expected. This emulation is performed through either a data or an address corruption. Data corruption is performed on memory on a write access so that the data that is stored within the memory core 101 emulates a fault. Address corruption can be made either on a read or on write access.

The FIM 200 allows choosing whether the memory core 101 receives its address and data from the BIST interface 208 or from the functional interface 106 or from the Random Data Corruption Module (RDCM) 300. Output data 209 is sent to the memory core 101 and might be corrupted by the RDCM 300. Output memory address 212 is sent to the memory core 101 and might be corrupted by the RDCM 300. When the IC is in emulation mode, data and address from the functional interface 106 are transmitted to the memory core 101. When the fault emulation mode is enabled, data or address corruption takes place on at least a memory access after a random period of time.

The corruption of the data is performed by the RDCM 300 and the memory address where the corruption has been performed is stored within a corrupted address register (CAR) 202. The corruption can be made either on the memory data 209 or the memory address 212. A dedicated signal 204 from the RDCM 300 informed the CAR 202 to save any corrupted memory address. After completing this procedure the FIM 200 reverts to a neutral mode, sending data from the functional interface 106 to the memory core 101 without corruption. When the corruption has been done on the memory address during a memory read, the detection delay counter (DDC) 203 is immediately starting.

The role of DDC 203 is to measure the time it takes the rest of the IC to detect that a corrupted value has been read. In case the corruption is done during a write access (on data or address), the DDC 203 starts counting on the next read access to memory. The DDC detects the failure when the read to memory is using an address where a corruption has been made, which could be considered either the corrupted address where the data was written, or the address where the data should have been written, or the first of these two addresses to be read.

When the detection is made, a detection 107 signal is sent back to the FIM 200. The value of the counter may be read through the control interface 207 in order to determine the time required to detect that corrupted data was provided. A signal 210 from the Random Data Corruption Module (RDCM) 300 module allows choosing whether the memory data 209 has to be corrupted or not. Another dedicated signal 211 is provided by the RDCM 300 to choose whether the memory address 212 has to be corrupted or not.

Figure 3:
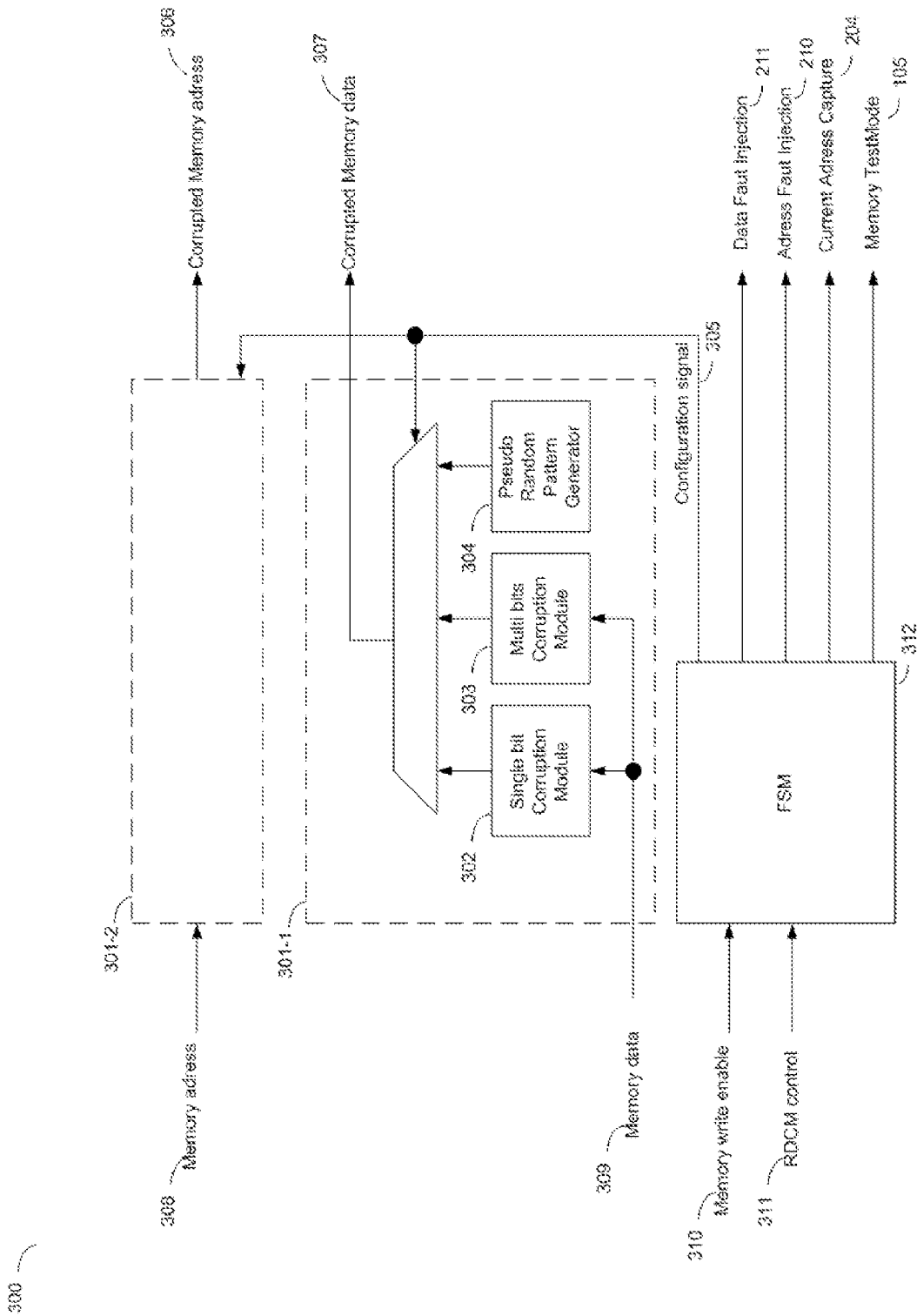
FIG. 3 is a schematic block diagram of a Random Data Corruption Module (RDCM) according to an embodiment.

FIG. 3 is an exemplary and non-limiting schematic of the RDCM 300 according to an embodiment. RDCM is controlled by the IC through the RDCM control interface 311. A non-limiting implementation of a corruption module CM 301-1 include the capability of corrupting a single bit of data through the Single Bit Corruption Module (SBCM) 302, to corrupt more bits through a Multi Bit Corruption Module (MBCM) 303, or to randomly replace the data by another through a pseudo random pattern generator 304. The corruption type choice is setup through the RDCM control interface 311 and sent to the CM 301-2 through configuration signal 305. Since the corruption can be applied either on memory data 309, on memory address 308 or both, the RDCM 300 includes a second CM module 301-2 dedicated to the corruption of the memory address. Corrupted memory address 306 and corrupted memory data 307 are then used by the FIM 200 and sent to the memory core 101. An internal finale state machine (FSM) 312 manages the different signals that are required by the FIM 200 to propagate the corrupted data 307 or the corrupted address 306 at the right time. The monitoring of the Memory Write Enable signal 310 allows the FSM 312 to determine the type of memory access being performed and then react accordingly.

Figure 4:
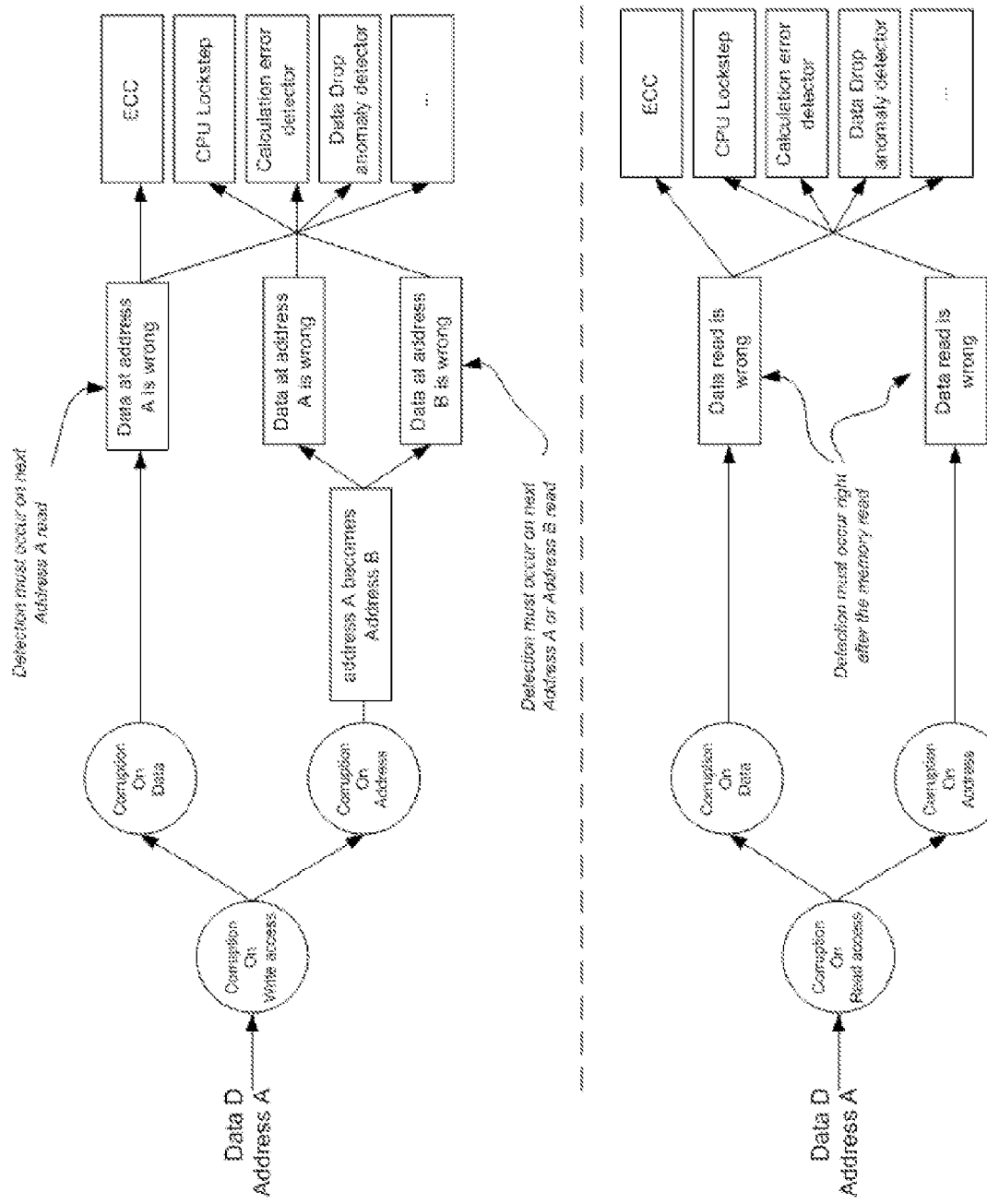
FIG. 4 is an illustration of the different type of corruption that can be performed and example of error detection mechanisms that can be then checked through this kind of fault emulation.

FIG. 4 represents the different types of error emulation that can be handled through the invention and the corresponding error detector IC features that can be checked thanks to this emulation. As described in this figure, the corruption of the memory core 101 content allows checking both the behavior of data integrity mechanisms such as ECC, but also any other feature that allows detecting a calculation error due to bad input data such as lockstep or data drop anomaly detector.

The principles of the invention are implemented as hardware or a combination of hardware, firmware, and software of any combination. With respect of firmware and software these are preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit. Furthermore, while a single memory core was described hereinabove, one of ordinary skill in the art would readily appreciate that a plurality of memory cores would be possible using the same principles disclosed herein without undue burden and therefore are specifically to be considered an integral part of the invention. An IC includes, also and without limitation a system on chip (SoC). The IC may be implemented as a monolithic semiconductor device.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An integrated circuit (IC) comprising:
   a fault injection module coupled between a built-in self-test module and a memory, via a test memory interface, the fault injection module having a data corruption module configured to either send functional data to the memory, or randomly corrupt a data and write the corrupted data into a memory address or write uncorrupted data into a corrupt memory address responsive to a write enable signal; and
   the fault injection module further comprises a detection interface allowing information exchange with error detection IC mechanisms.

2. The IC of claim 1, further comprising:
   the memory having a built-in self-test module.

3. The IC of claim 1 wherein the fault injection module is configured to corrupt data to be written into a memory address or to corrupt a memory address to which data is to be written to or from which data is to be read by a single bit corruption module.

4. The IC of claim 1 wherein the fault injection module is configured to corrupt data to be written into a memory address or to corrupt a memory address to which data is to be written to or from which data is to be read by a multi bit corruption module.

5. The IC of claim 1 wherein the fault injection module is configured to corrupt data to be written into a memory address or to corrupt a memory address to which data is to be written or from which data is to be read by a pseudo random pattern generator.

6. The IC of claim 1, wherein the fault injection module further comprises:
   a random data corruption module configured to randomly corrupt the data to be written into an address of the memory or to corrupt the data that is to be written into or read from the memory address.

7. The IC of claim 1, wherein the fault injection module further comprises:
   a corrupted address register to which the address of the memory is written upon corruption of data in the respective memory address, or to which the corrupted address is written.

8. The IC of claim 7, wherein the fault injection module further comprises:
   a detection delay counter.

9. The IC of claim 8, wherein the fault injection module is further configured to activate the detection delay counter to begin counting upon detection that a read from the memory from an address stored in the corrupted address register is attempted.

10. The IC of claim 9 wherein addresses stored in the corrupted address register are the addresses into which corrupted data has been written.

11. The IC of claim 9 wherein addresses stored in the corrupted address register are the corrupted addresses.

12. The IC of claim 9 wherein addresses stored in the corrupted address register are the corrupted address and the address before corruption.

13. The IC of claim 8 wherein the fault injection module is configured to receive an error signal and provide count information from the detection delay counter responsive thereto.

14. The IC of claim 1, wherein the IC comprises a system on a chip.

15. The IC of claim 1, wherein the IC is implemented as a monolithic semiconductor device.

* * * * *